United States Patent
Kang

(10) Patent No.: US 8,207,823 B2
(45) Date of Patent: Jun. 26, 2012

(54) INTEGRATED CIRCUIT AND METHOD FOR WRITING INFORMATION

(75) Inventor: Hee Bok Kang, Cheongju-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 963 days.

(21) Appl. No.: 11/645,761

(22) Filed: Dec. 27, 2006

(65) Prior Publication Data

US 2007/0290706 A1     Dec. 20, 2007

(30) Foreign Application Priority Data

Jun. 2, 2006   (KR) .................. 10-2006-0049860

(51) Int. Cl.
*H04Q 5/22* (2006.01)
*G08B 13/14* (2006.01)
*H03K 17/62* (2006.01)
*G01R 31/28* (2006.01)

(52) U.S. Cl. ............... 340/10.1; 340/572.1; 340/572.7; 340/14.61; 714/724

(58) Field of Classification Search ........ 340/10.1, 340/14.61, 572.7, 572.1; 714/724
See application file for complete search history.

(56) References Cited

U.S. PATENT DOCUMENTS

| | | | | |
|---|---|---|---|---|
| 5,448,110 A * | 9/1995 | Tuttle et al. | | 257/723 |
| 5,764,655 A * | 6/1998 | Kirihata et al. | | 714/733 |
| 5,786,626 A * | 7/1998 | Brady et al. | | 257/673 |
| 6,011,734 A * | 1/2000 | Pappert | | 365/200 |
| 6,097,622 A | 8/2000 | Shimizu et al. | | |
| 6,107,920 A * | 8/2000 | Eberhardt et al. | | 340/572.7 |
| 6,268,796 B1 * | 7/2001 | Gnadinger et al. | | 340/572.5 |
| 6,331,782 B1 * | 12/2001 | White et al. | | 324/763 |
| 6,775,172 B2 | 8/2004 | Kang et al. | | |
| 7,325,180 B2 * | 1/2008 | Pileggi et al. | | 714/724 |
| 7,651,882 B1 * | 1/2010 | Bockorick et al. | | 438/64 |
| 7,667,231 B2 * | 2/2010 | Hyde et al. | | 257/48 |
| 2003/0234393 A1 * | 12/2003 | Cowles et al. | | 257/48 |
| 2004/0154417 A1 * | 8/2004 | Renken et al. | | 73/866.1 |
| 2005/0026315 A1 * | 2/2005 | Cowles et al. | | 438/18 |
| 2006/0125505 A1 * | 6/2006 | Glidden et al. | | 324/765 |
| 2006/0125507 A1 * | 6/2006 | Hyde et al. | | 324/765 |
| 2006/0125508 A1 * | 6/2006 | Glidden et al. | | 324/765 |
| 2006/0232419 A1 * | 10/2006 | Tomioka et al. | | 340/572.7 |
| 2007/0290706 A1 * | 12/2007 | Kang | | 324/765 |

(Continued)

FOREIGN PATENT DOCUMENTS

JP         08-077317         3/1996

(Continued)

*Primary Examiner* — Benjamin C Lee
*Assistant Examiner* — Omeed Alizada
(74) *Attorney, Agent, or Firm* — IP & T Group LLP

(57) ABSTRACT

An integrated circuit is provided. The integrated circuit includes an RFID tag configured to store various administrative information after testing at a wafer level in response to a radio frequency signal, and an interface unit configured to perform the function of an interface between the integrated circuit and the RFID tag for storing the information in the RFID tag. An antenna of the RFID tag is formed using a wire and a lead frame. A method for writing information of an integrated circuit is also provided. The method includes the steps of performing a wafer processing of an integrated circuit having a RFID tag; performing a wafer level test of the integrated circuit; transmitting and receiving a radio frequency signal to store various administrative information in the RFID tag; and storing a chip confirmation code in the RFID tag.

6 Claims, 14 Drawing Sheets

U.S. PATENT DOCUMENTS

| | | | |
|---|---|---|---|
| 2009/0027162 A1* | 1/2009 | Forster | 340/10.1 |
| 2009/0219152 A1* | 9/2009 | Angelo et al. | 340/540 |

FOREIGN PATENT DOCUMENTS

| | | |
|---|---|---|
| JP | 2003273179 | 9/2003 |
| JP | 2005030877 | 2/2005 |
| JP | 2005057203 | 3/2005 |
| JP | 2005-101657 | 4/2005 |
| JP | 2005-243857 | 9/2005 |
| JP | 2006066806 | 3/2006 |
| JP | 2006066806 A * | 3/2006 |
| KR | 10-2005-0083323 | 8/2005 |

* cited by examiner

INTEGRATED CIRCUIT AND METHOD FOR WRITING INFORMATION

RELATED APPLICATION

The present application claims the benefit of priority to Korean patent application number 10-2006-0049860, filed on Jun. 2, 2006, which is incorporated herein by reference in its entirety.

BACKGROUND

1. Technical Field

The present invention generally relates to an integrated circuit and a method for writing information, and more specifically, to an integrated circuit having a Radio Frequency Identification (RFID) which includes an On-Package antenna to facilitate analysis of defects.

2. Description of the Related Art

An integrated circuit is a basic device that has been used in various electric apparatus fields such as a computer system or a communication system. For example, the integrated circuit includes a memory device, a Digital Signal Processor (DSP), a System On Chip (SOC) and an RFID tag.

As an example of these integrated circuits, a nonvolatile ferroelectric memory, that is, Ferroelectric Random Access Memory (FeRAM) devices have attracted considerable attention as next generation memory devices because of data processing speeds as fast as a Dynamic Random Access Memory (DRAM), and conserving data even after the power is turned off.

An FeRAM having a structure similar to that of a DRAM includes capacitors made of a ferroelectric substance, which have a high residual polarization allowing for data retention after power is turned off.

In the integrated circuits such as a memory chip, a Central Processing Unit (CPU) or a System On Chip (SOC), various administrative items like test, defect analysis, and stock management have been required to be promptly managed systematically and inexpensively after a wafer level process. In other words, the information on test results after the wafer level test is written in each chip. Otherwise, the processing results of the next step are re-written to increase the efficiency in the subsequent process.

In this way, when the process results are written in each intermediate step and administrative information is continuously updated after the integrated circuits are tested at the wafer level, the processing efficiency can be improved. Moreover, it is necessary to administer information in each step because semiconductor chips have been produced with high added value.

SUMMARY

Various embodiments consistent with the present invention are directed at providing an integrated circuit having an RFID tag to accumulate administrative information of the integrated circuit easily. After a wafer level test, test results or processing results of the next step are written in each chip to increase the efficiency of the subsequent processes. An antenna of the RFID tag in the integrated circuit is formed of a wire and a lead frame metal so that an additional antenna structure is not required.

Consistent with an embodiment of the present invention, there is provided an integrated circuit comprising an RFID tag configured to store various administrative information after testing at a wafer level in response to a radio frequency signal.

Consistent with an embodiment of the present invention, there is provided an integrated circuit comprising an RFID tag configured to store various administrative information after testing at a wafer level in response to a radio frequency signal, and an interface unit configured to perform the function of an interface between the integrated circuit and the RFID tag for storing the information in the RFID tag.

Consistent with an embodiment of the present invention, a method for writing information of an integrated circuit comprises the steps of: performing a wafer processing of an integrated circuit having an RFID tag; performing a wafer level test of the integrated circuit; and transceiving a radio frequency signal to store various administrative information in the RFID tag.

DETAILED DESCRIPTION

The present invention will be described in detail with reference to the accompanying drawings.

Figure 1:
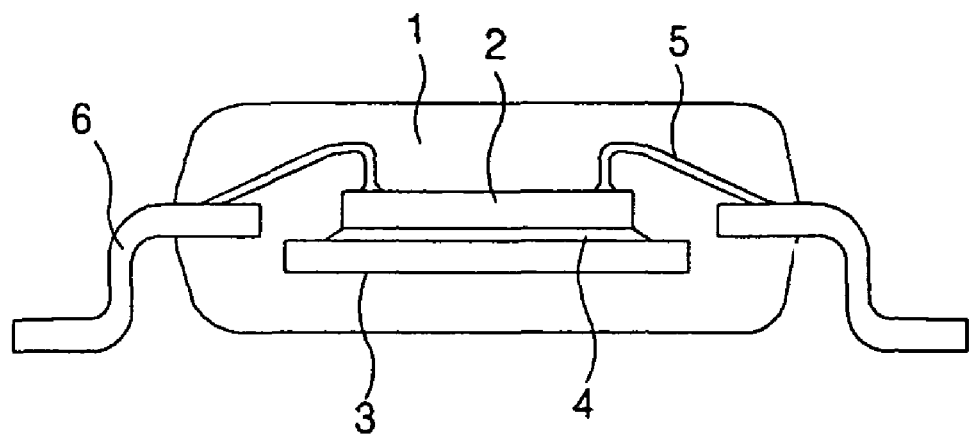
FIG. 1 is a cross-sectional diagram illustrating a Small Outline Package (SOP) chip having an On-Package antenna structure consistent with an embodiment of the present invention.

FIG. 1 is a cross-sectional diagram illustrating a Small Outline Package (SOP) chip having an On-Package antenna structure consistent with an embodiment of the present invention.

The integrated circuit of FIG. 1 represents a chip 2 having a Radio Frequency Identification (RFID) tag in an epoxy resin 1. The chip 2 is formed over a stage 3 and connected to the stage 3 through a paste 4. The chip 2 is connected to a lead 6 through a wire 5. Wire 5 and lead 6 may be formed of a lead frame metal and are used as an on-package antenna for transmitting a Radio Frequency (RF) signal.

Figure 2:
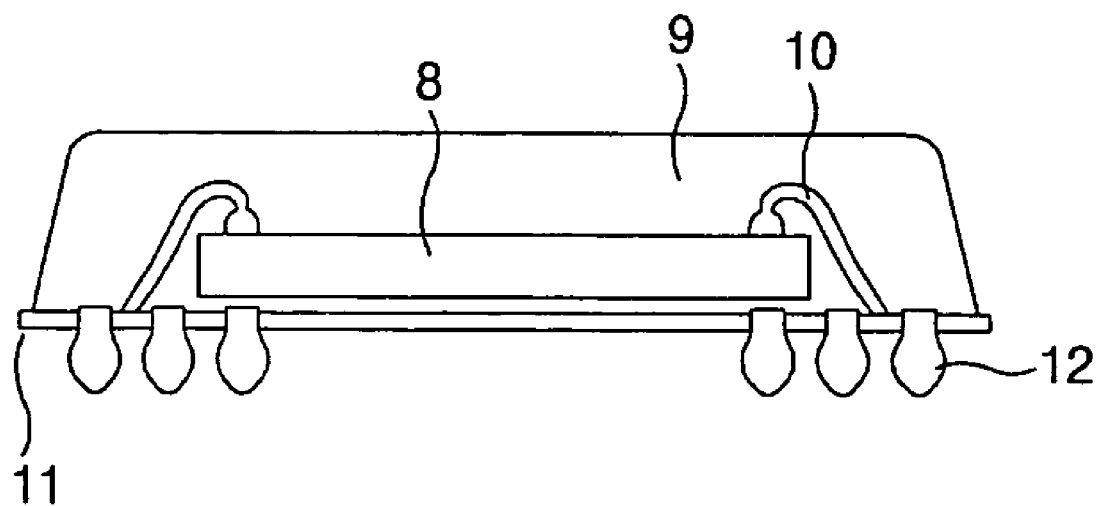
FIG. 2 is a cross-sectional diagram illustrating a Fine Pitch Ball Grid Array (FBGA) package chip having an On-Package antenna structure consistent with an embodiment of the present invention.

FIG. 2 is a cross-sectional diagram illustrating a Fine Pitch Ball Grid Array (FBGA) package chip having an On-Package antenna structure consistent with an embodiment of the present invention.

The integrated circuit of FIG. 2 represents a chip 8 having an RFID tag surrounded by a capsule 9. Chip 8 is connected to a solder 12 attached to a lower side of a substrate 11 through a wire 10. Wire 10 and solder 12 formed of a lead frame metal are used as an on-package antenna for transmitting an RF signal.

Figure 3:
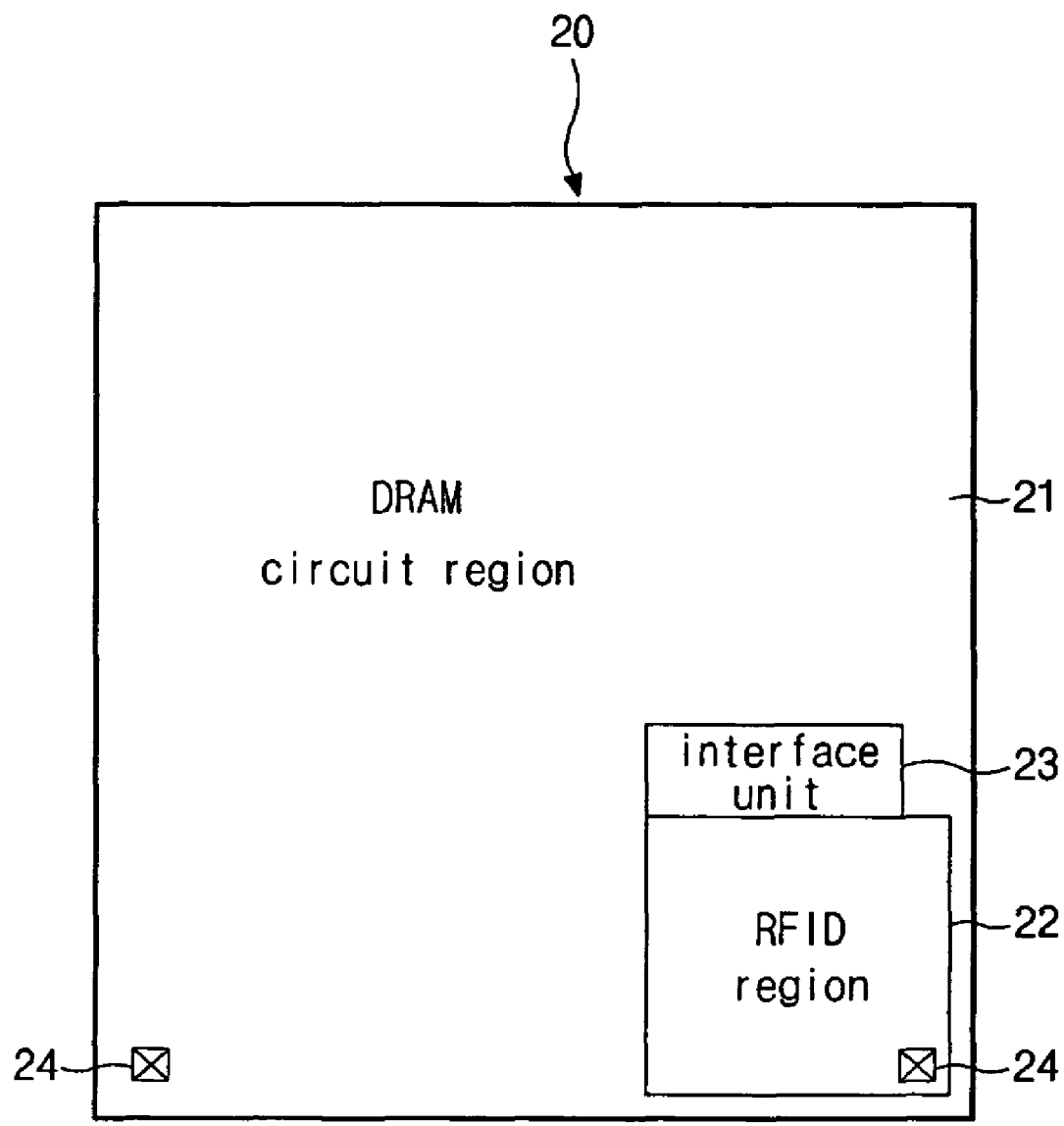
FIG. 3 is a plan diagram illustrating a DRAM chip consistent with an embodiment of the present invention.

FIG. 3 is a plan diagram illustrating a DRAM chip consistent with an embodiment of the present invention.

The integrated circuit of FIG. 3 is a DRAM chip 20 having an RFID circuit. DRAM chip 20 includes a DRAM circuit region 21, an RFID region 22 having an RFID circuit, an interface unit 23, and antenna pads 24.

DRAM circuit region 21 is capable of also storing a high capacity of data.

Interface unit 23 performs the function of an interface for storing information in RFID region 22 between DRAM circuit region 21 and RFID region 22.

RFID region 22 stores information of DRAM circuit region 21 which is received through interface unit 23. RFID region 22 may further include an FeRAM.

Antenna pads 24 are located at one place on DRAM circuit region 21 and at another place on RFID region 22. Antenna pads 24 are connected to the antenna formed of wires 5, 10 and leads 6, 12 of FIG. 1 or 2. That is, antenna pads 24 connected to wires 5, 10 and leads 6, 12 form an on-package antenna structure.

The on-package antenna structure of FIG. 1 or 2 transmits and receives an RF signal with an external communication apparatus.

Figure 4:
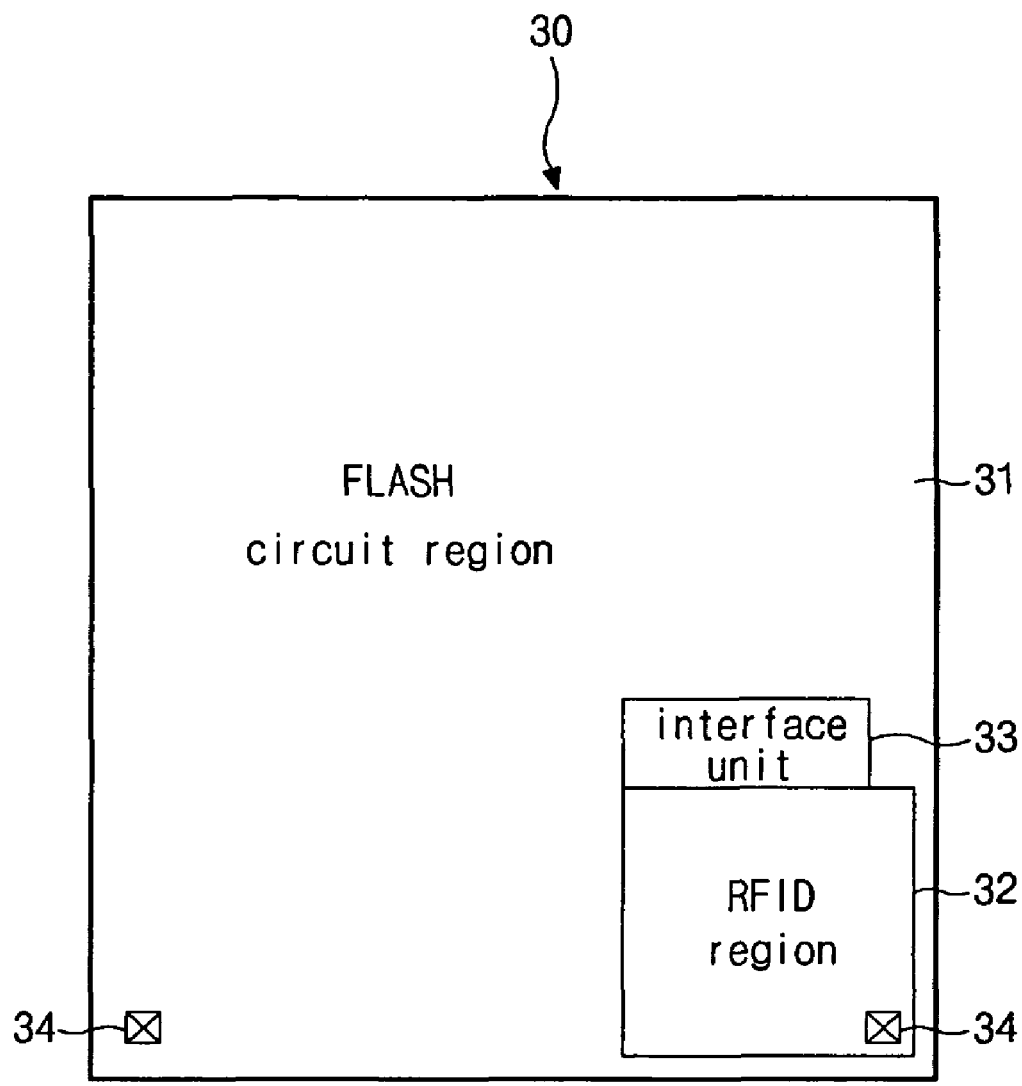
FIG. 4 is a plan diagram illustrating a flash memory chip consistent with an embodiment of the present invention.

FIG. 4 is a plan diagram illustrating a flash memory chip consistent with an embodiment of the present invention.

The integrated circuit of FIG. 4 is a flash memory chip 30 having an RFID circuit. Flash memory chip 30 includes a flash memory circuit region 31, a RFID region 32 having an RFID circuit, an interface unit 33, and antenna pads 34.

Flash memory circuit region 31 may be capable of storing a high capacity of data.

Interface unit 33 performs the function of an interface for storing information in the RFID region 32 between flash memory circuit region 31 and RFID region 32.

RFID region 32 stores information of flash memory circuit region 31 that is received through interface unit 33. RFID region 32 may include an FeRAM or a flash cell.

Antenna pads 34 are located at one place on flash memory circuit region 31 and at another place on RFID region 32. Antenna pads 34 are connected to an antenna formed of wires 5, 10 and leads 6, 12 of FIG. 1 or 2. That is, antenna pads 34 connected to wires 5, 10 and leads 6, 12 form an on-package antenna structure.

The on-package antenna structure of FIG. 1 or 2 transceives an RF signal with an external communication apparatus.

Figure 5:
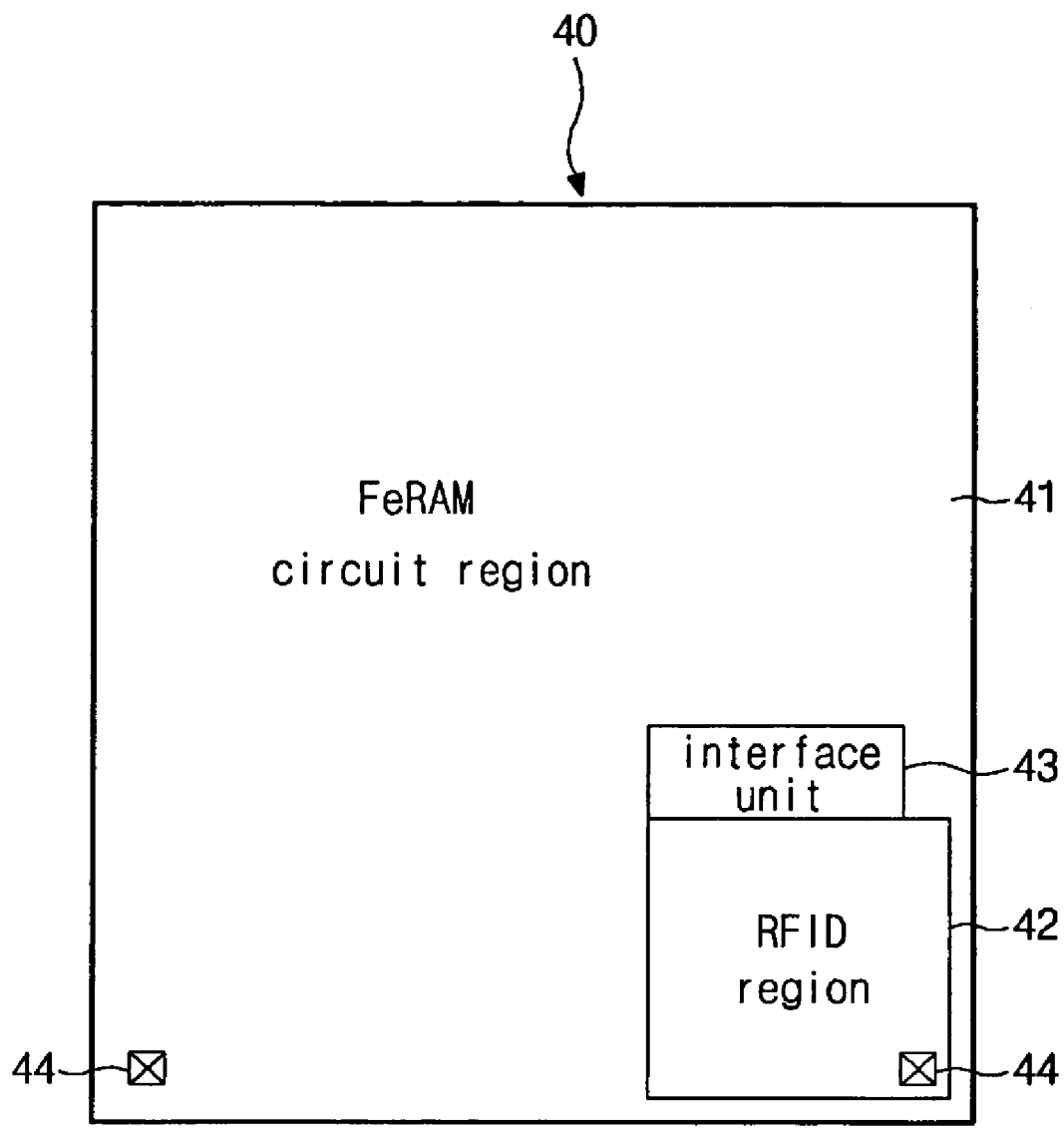
FIG. 5 is a plan diagram illustrating a FeRAM chip consistent with an embodiment of the present invention.

FIG. 5 is a plan diagram illustrating a FeRAM chip according to an embodiment of the present invention.

The integrated circuit of FIG. 5 is a FeRAM chip 40 having an RFID circuit. FeRAM chip 40 includes a FeRAM circuit region 41, an RFID region 43 having a RFID circuit, an interface unit 43, and antenna pads 44.

FeRAM circuit region 41 may be capable of storing a high capacity of data.

Interface unit 43 performs the function of an interface for storing information in RFID region 42 between. FeRAM circuit region 41 and RFID region 42.

RFID region 42 stores information of FeRAM circuit region 41 that is received through interface unit 43. RFID region 42 may include an FeRAM.

Antenna pads 44 are located at one place on FeRAM circuit region 41 and at another place on RFID region 42. Antenna pads 34 are connected to an antenna formed of wires 5, 10 and leads 6, 12 of FIG. 1 or 2. That is, antenna pads 44 connected to wires 5, 10 and leads 6, 12 form an on-package antenna structure.

The on-package antenna structure of FIG. 1 or 2 transceives an RF signal with an external communication apparatus.

Figure 6:
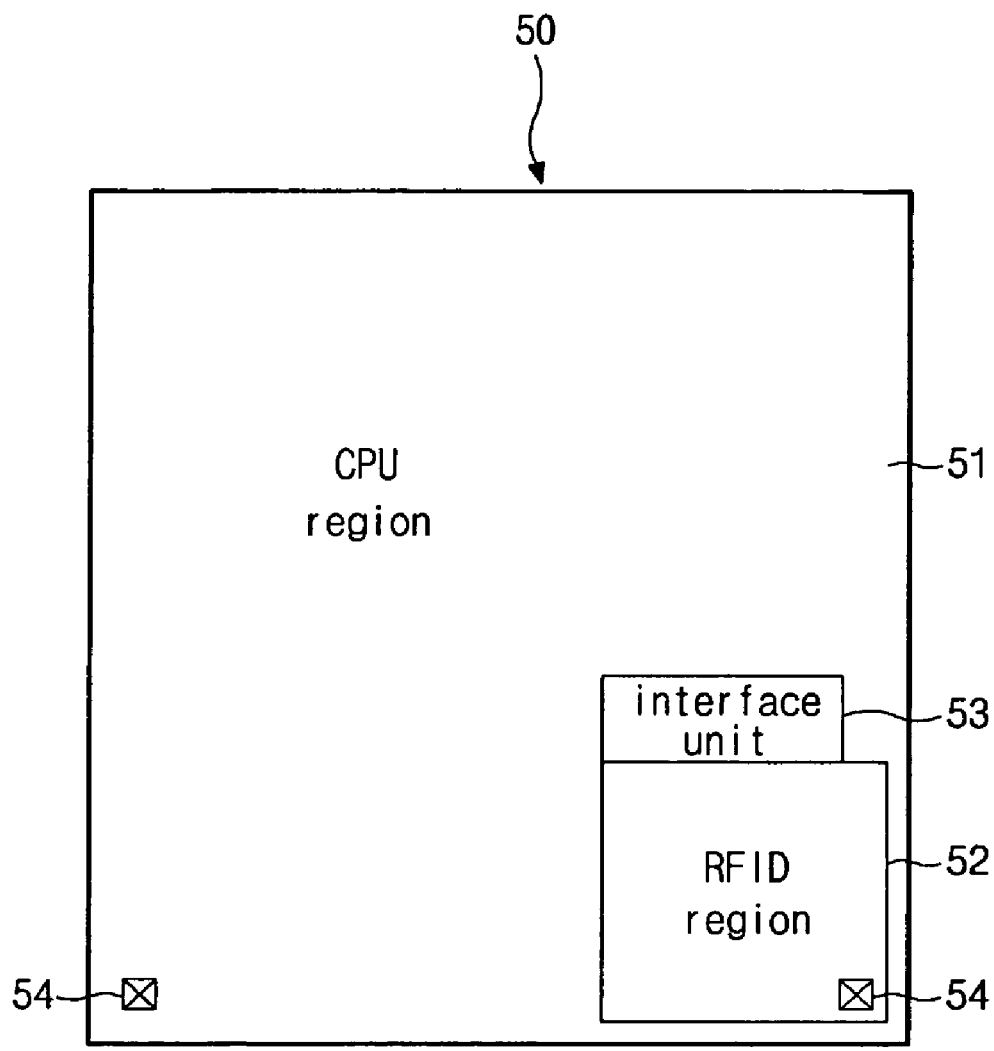
FIG. 6 is a plan diagram illustrating a CPU chip consistent with an embodiment of the present invention.

FIG. 6 is a plan diagram illustrating a Central Processing Unit (CPU) chip according to an embodiment of the present invention.

The integrated circuit of FIG. 6 is a CPU chip 50 having an RFID circuit. CPU chip 50 includes a CPU region 51 which acts as: a circuit region, an RFID region 52 having an RFID circuit, an interface unit 53, and antenna pads 54.

Interface unit 53 performs the function of an interface for storing information in RFID region 52 between CPU region 51 and RFID region 52.

RFID region 52 stores information of CPU region 51 that is received through interface unit 53. RFID region 52 may include a FeRAM.

Antenna pads 54 are located at one place on CPU region 51 and at another place on RFID region 52. Antenna pads 54 are connected to an antenna formed of wires 5, 10 and leads 6, 12 of FIG. 1 or 2. That is, antenna pad 54 connected to wires 5, 10 and leads 6, 12 form an on-package antenna structure.

The on-package antenna structure of FIG. 1 or 2 transceives an RF signal with an external communication apparatus.

Figure 7:
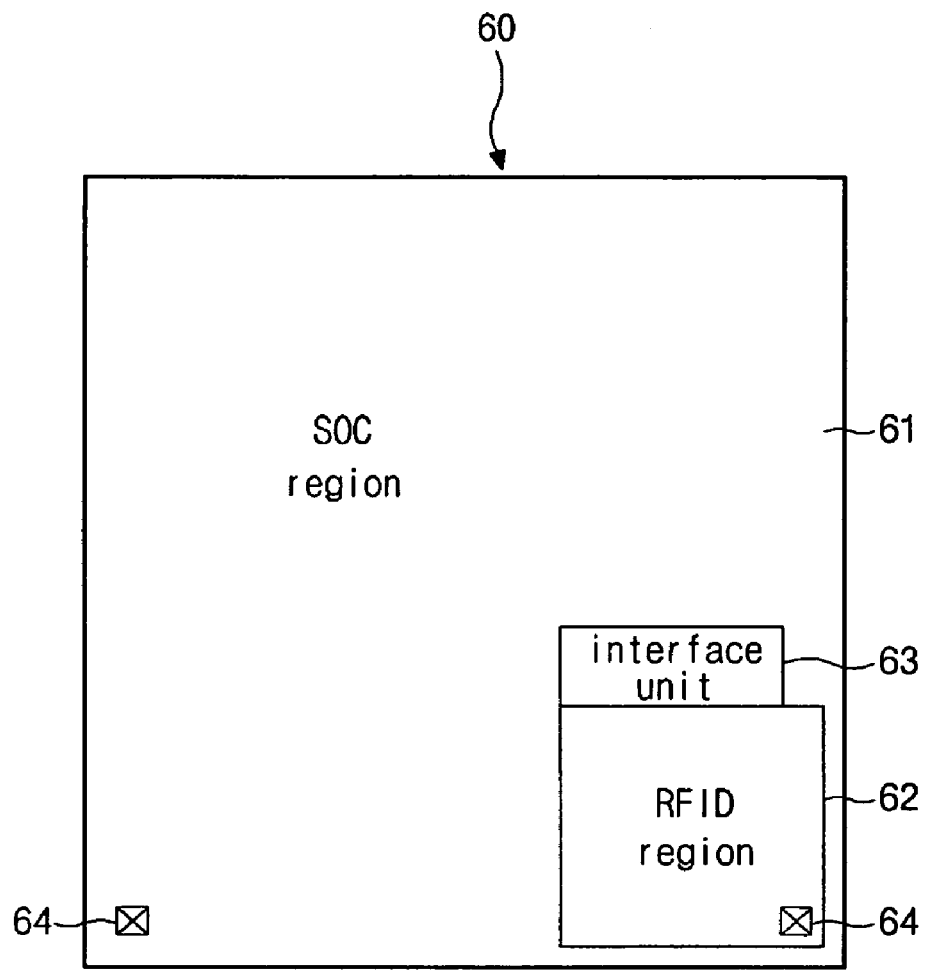
FIG. 7 is a plan diagram illustrating an SOC consistent with an embodiment of the present invention.

FIG. 7 is a plan diagram illustrating a System On Chip (SOC) consistent with an embodiment of the present invention.

The integrated circuit of FIG. 7 is a SOC chip 60 having a RFID circuit. The SOC chip 60 includes a SOC region 61 which acts as a circuit region, a RFID region 62 having a RFID circuit, an interface unit 63, and antenna pads 64.

Interface unit 63 performs the function of an interface for storing information in RFID region 62 between SOC region 61 and RFID region 62.

RFID region 62 stores information of SOC region 61 that is received through interface unit 63. RFID region 62 may include a FeRAM.

Antenna pads 64 are located at one place on SOC region 61 and at another place on RFID region 62. A antenna pads 64 are connected to an antenna formed of wires 5, 10 and leads 6, 12 of FIG. 1 or 2. That is, antenna pad 64 connected to wires 5, 10 and leads 6, 12 form an on-package antenna structure.

The on-package antenna structure of FIG. 1 or 2 transceives an RF signal with an external communication apparatus.

Figure 8:
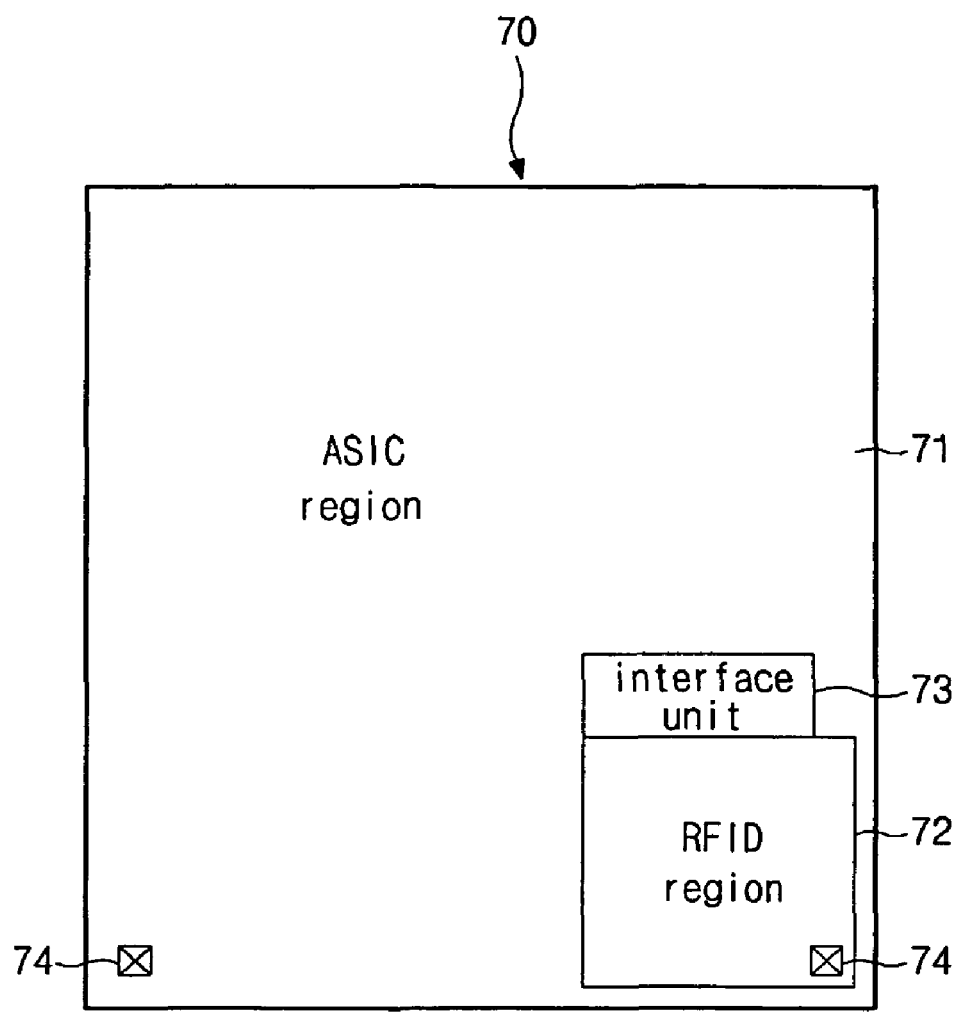
FIG. 8 is a plan diagram illustrating an ASIC chip consistent with an embodiment of the present invention.

FIG. 8 is a plan diagram illustrating an Application Specific Integrated Circuit (ASIC) chip consistent with an embodiment of the present invention.

The integrated circuit of FIG. 8 is an ASIC chip 70 having an RFID circuit. ASIC chip 70 includes an ASIC region 71 which acts as a circuit region, an RFID region 72 having a RFID circuit, an interface unit 73, and antenna pads 74.

Interface unit 73 performs the function of an interface for storing information in RFID region 72 between ASIC region 71 and RFID region 72.

RFID region 72 stores information of the ASIC region 71 that is received through interface unit 73. RFID region 72 may include a FeRAM.

Antenna pads 74 are located at one place on ASIC region 71 and at another place on RFID region 72. Antenna pads 74 are connected to an antenna formed of wires 5, 10 and leads 6, 12 of FIG. 1 or 2. That is, antenna pads 74 connected to wires 5, 10 and leads 6, 12 form an on-package antenna structure.

The on-package antenna structure of FIG. 1 or 2 transceives an RF signal with an external communication apparatus.

Figure 9:
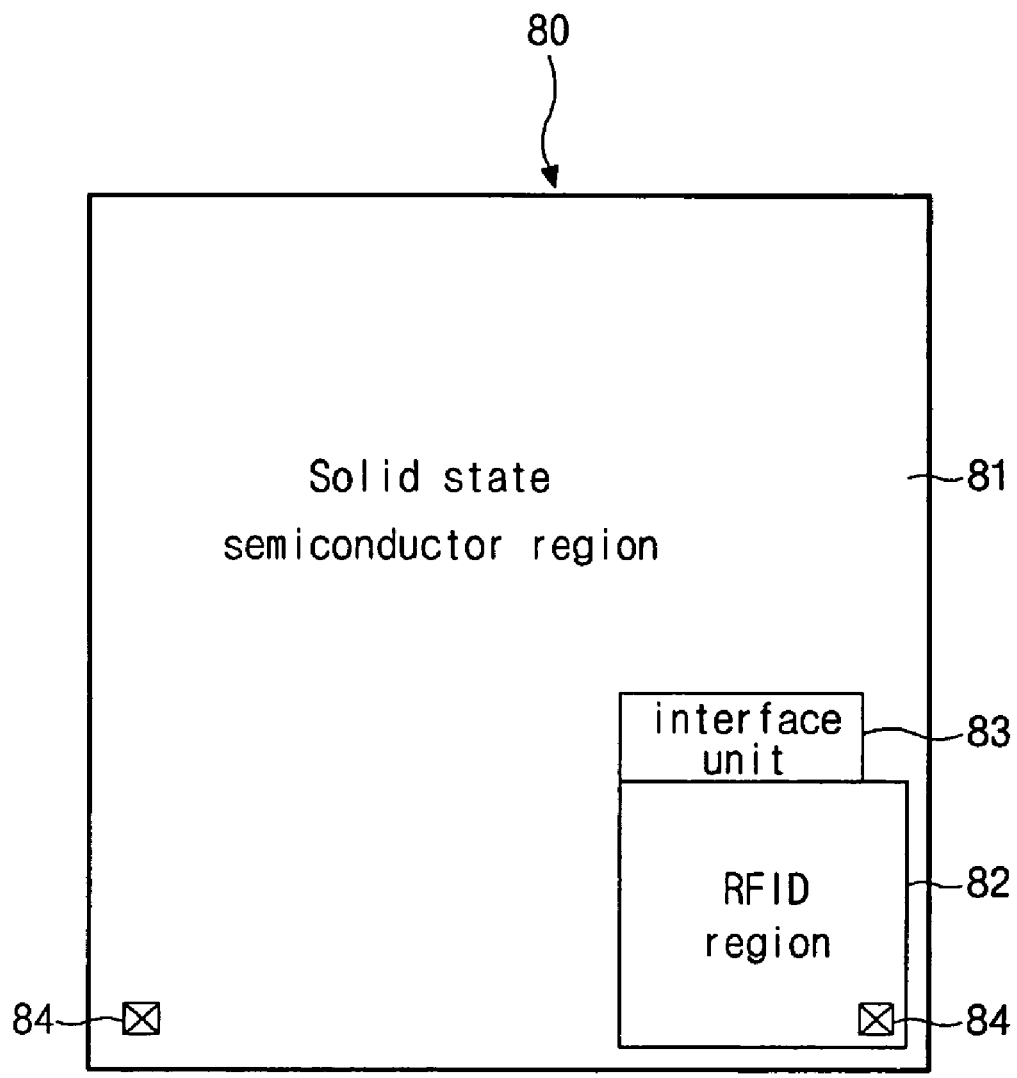
FIG. 9 is a plan diagram illustrating a solid state semiconductor chip consistent with an embodiment of the present invention.

FIG. 9 is a plan diagram illustrating a solid state semiconductor chip consistent with an embodiment of the present invention.

The integrated circuit of FIG. 9 is a solid state semiconductor chip 80 having an RFID circuit. Solid state semiconductor chip 80 includes a solid state semiconductor region 81, an RFID region 82 having an RFID circuit, an interface unit 83, and antenna pads 84.

The solid state semiconductor region 81 may be a semiconductor circuit region of high capacity.

Interface unit 83 performs the function of an interface for storing information in RFID region 82 between solid state semiconductor region 81 and RFID region 82.

RFID region 82 stores information of solid state semiconductor region 81 that is received through interface unit 83. RFID region 82 may include a FeRAM.

Antenna pads 84 are located at one place on solid state semiconductor region 81 and at another place on RFID region 82. Antenna pads 84 are connected to an antenna formed of wires 5, 10 and leads 6, 12 of FIG. 1 or 2. That is, antenna pads 84 connected to wires 5, 10 and leads 6, 12 form an on-package antenna structure.

The on-package antenna structure of FIG. 1 or 2 transceives an RF signal with an external communication apparatus.

Figure 10:
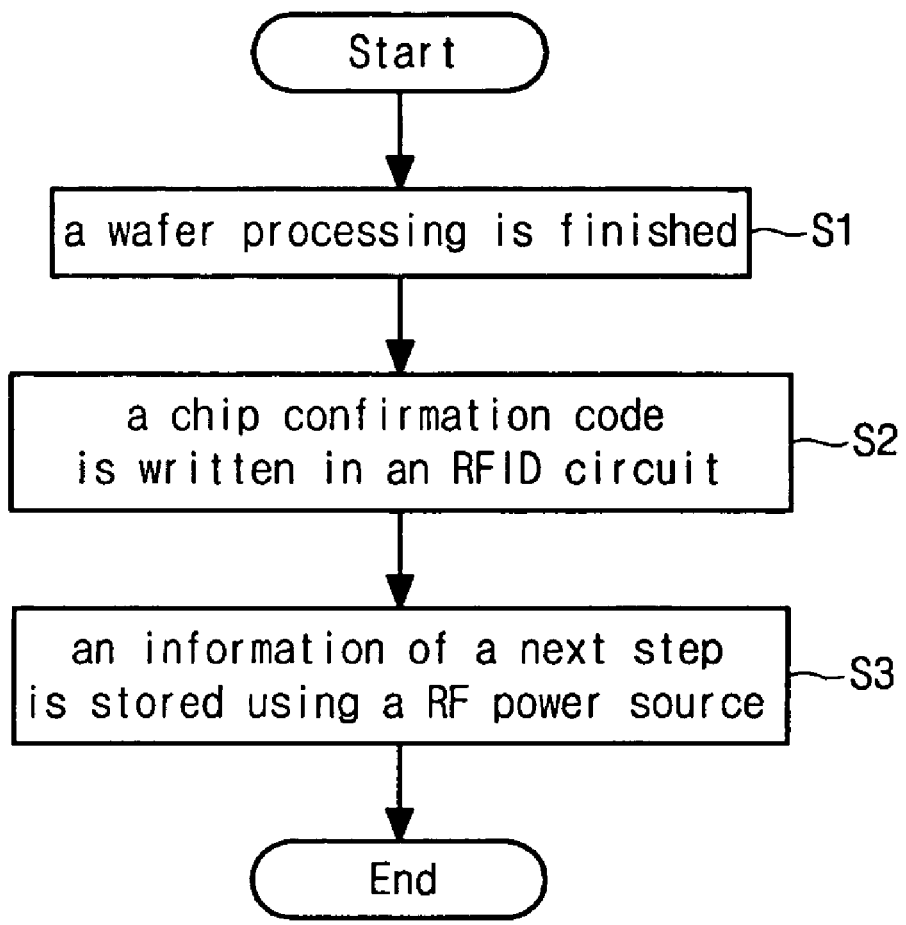
FIG. 10 is a flow chart illustrating a method for writing information in an integrated circuit consistent with an embodiment of the present invention.

FIG. 10 is a flow chart illustrating a method for writing information on an integrated circuit consistent with an embodiment of the present invention.

First, the wafer processing of an integrated circuits, such as DRAM chip 20, flash chip 30, FeRAM chip 40, CPU chip 50, SOC chip 60, ASIC chip 70, and solid state semiconductor chip 80, shown in FIG. 3-9, is finished (S1). Then, the integrated circuit is tested.

When the integrated circuits are tested at a wafer level, a chip confirmation code is written in the RFID circuit of the integrated circuit through the interface unit (S2).

Next, information obtained in any subsequent testing or processing of the integrated circuit is stored in the RFID circuit region using an RF power source applied to the RFID circuit region, waiting the test and processing results of the integrated circuit. That is, after the wafer-level-test of the integrated circuit, subsequent test results or processing results are written in each integrated circuit to increase the efficiency of the subsequent processes.

Figure 11:
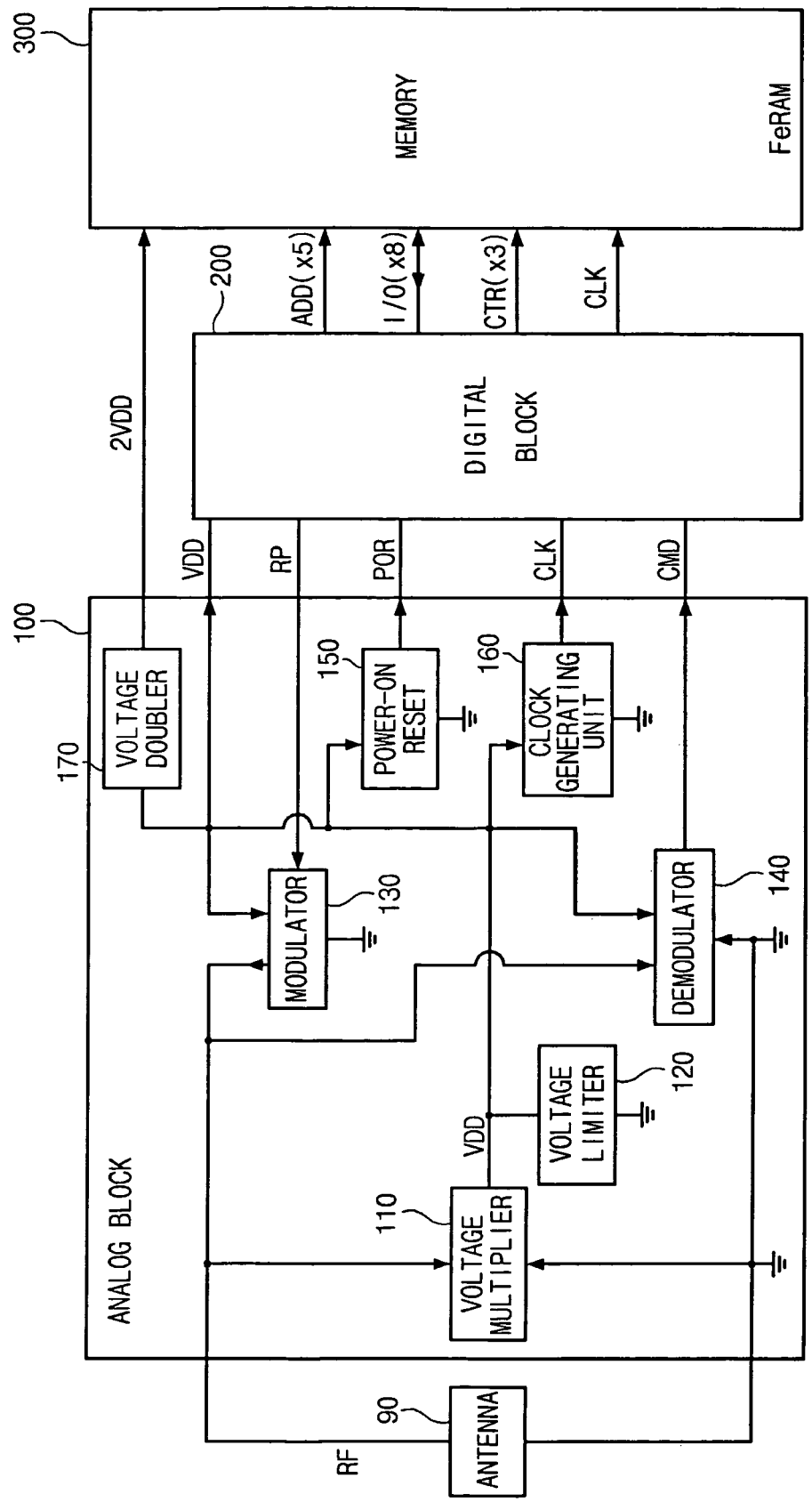
FIG. 11 is a block diagram illustrating an RFID region of an integrated circuit consistent with an embodiment of the present invention.

FIG. 11 is a block diagram illustrating an RFID region of an integrated circuit according to an embodiment of the present invention.

The RFID region includes an antenna 90, an analog block 100, a digital block 200, and a memory block 300.

The antenna 90 transmits and receives data between an external reader or writer and an RFID.

The analog block 100 includes a voltage multiplier 110, a voltage limiter 120, a modulator 130, a demodulator 140, a power-on reset unit 150, a clock generating unit 160, and a voltage doubler 170.

Antenna 90 receives an RF signal. This RF signal is applied to voltage multiplier 110, which generates a power voltage VDD that acts as a driving voltage of the RFID. Power voltage VDD is limited by voltage limiter 120.

Modulator 130 modulates a response signal RP applied from the digital block 200 to transmit the signal to the antenna 90.

Demodulator 140 detects an operation command signal in the RF signal applied from the antenna 90, depending on an output voltage of the voltage multiplier 110 and the voltage limiter 120, to output the command signal CMD to the digital block 200.

Power-on reset unit 150 senses the power voltage VDD output from voltage multiplier 110 and outputs a power-on reset signal POR to control a reset operation of digital block 200.

Clock generating unit 160 generates a clock signal CLK to digital block 200 to control the operation of digital block 200 depending on power voltage VDD output from voltage multiplier 110.

Power voltage VDD is applied to voltage doubler 170, which generates a high voltage 2VDD.

Digital block 200 receives power voltage VDD, power-on reset signal POR, clock signal CLK, and command signal CMD from analog block 100 and outputs response signal RP to analog block 100.

Digital block 200 outputs an address ADD, input/output data I/O, a chip enable signal CE, and control signals CTR including an output enable signal OE and a write enable signal WE to memory block 300.

Memory block 300 reads and writes data with a nonvolatile ferroelectric capacitor.

Figure 12:
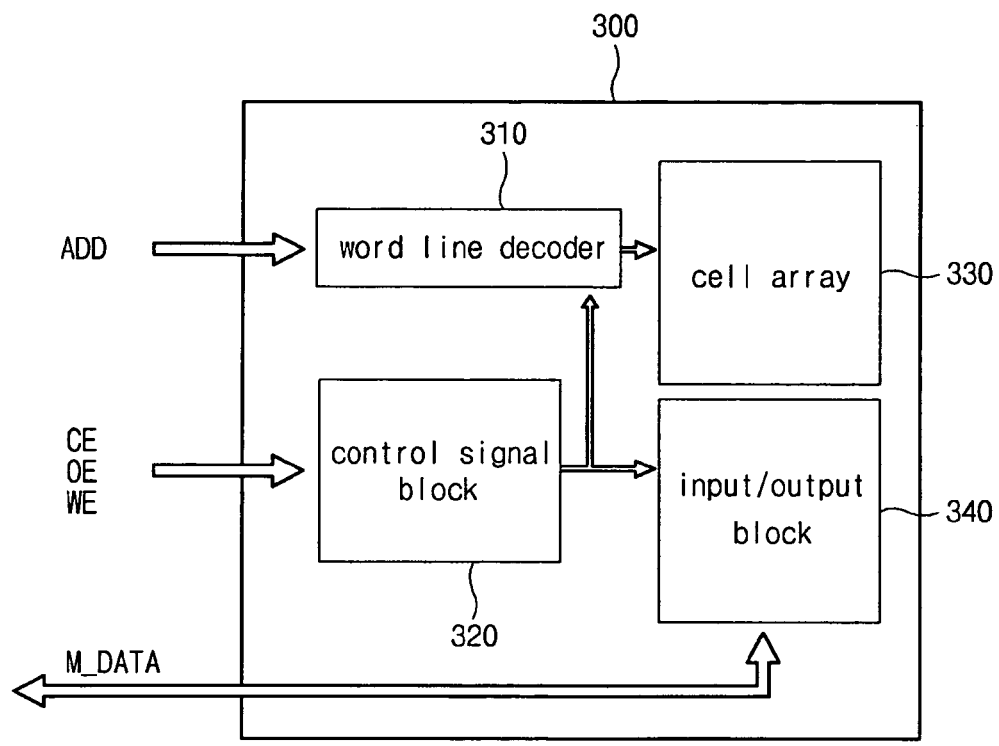
FIG. 12 is a block diagram illustrating a memory block of FIG. 11.

FIG. 12 is a block diagram illustrating the memory block 300. Memory block 300 includes a word line decoder 310, a control signal block 320, a cell array 330, and an input/output block 340.

Word line decoder 310 decodes address ADD applied from digital block 200 to select a word line WL.

Control signal block 320 controls read/write operations in response to the chip enable signal CE, the output enable signal OE, and the write enable signal WE, which are applied from digital block 200.

Control signal block 320 outputs a write enable signal for writing in cell array 330, a sense amplifier enable signal for controlling activation of sense amplifiers, an output enable signal for outputting data sensed in the sense amplifiers to a data bus M_DATA, and data applied from data bus M_DATA.

Cell array 330 includes a plurality of unit cells each having a nonvolatile ferroelectric capacitor and a switching element, stores data in the nonvolatile ferroelectric capacitor so that the stored data may be read.

Input/output block 340 is controlled by the sense amplifier enable signal, the output enable signal OE, and the write enable signal WE with a reference voltage. Input/output block 340 senses and amplifies data applied from cell array 330 to output the data to the data bus M_DATA, and transmits the data provided from the data bus M_DATA to cell array 330.

Figure 13:
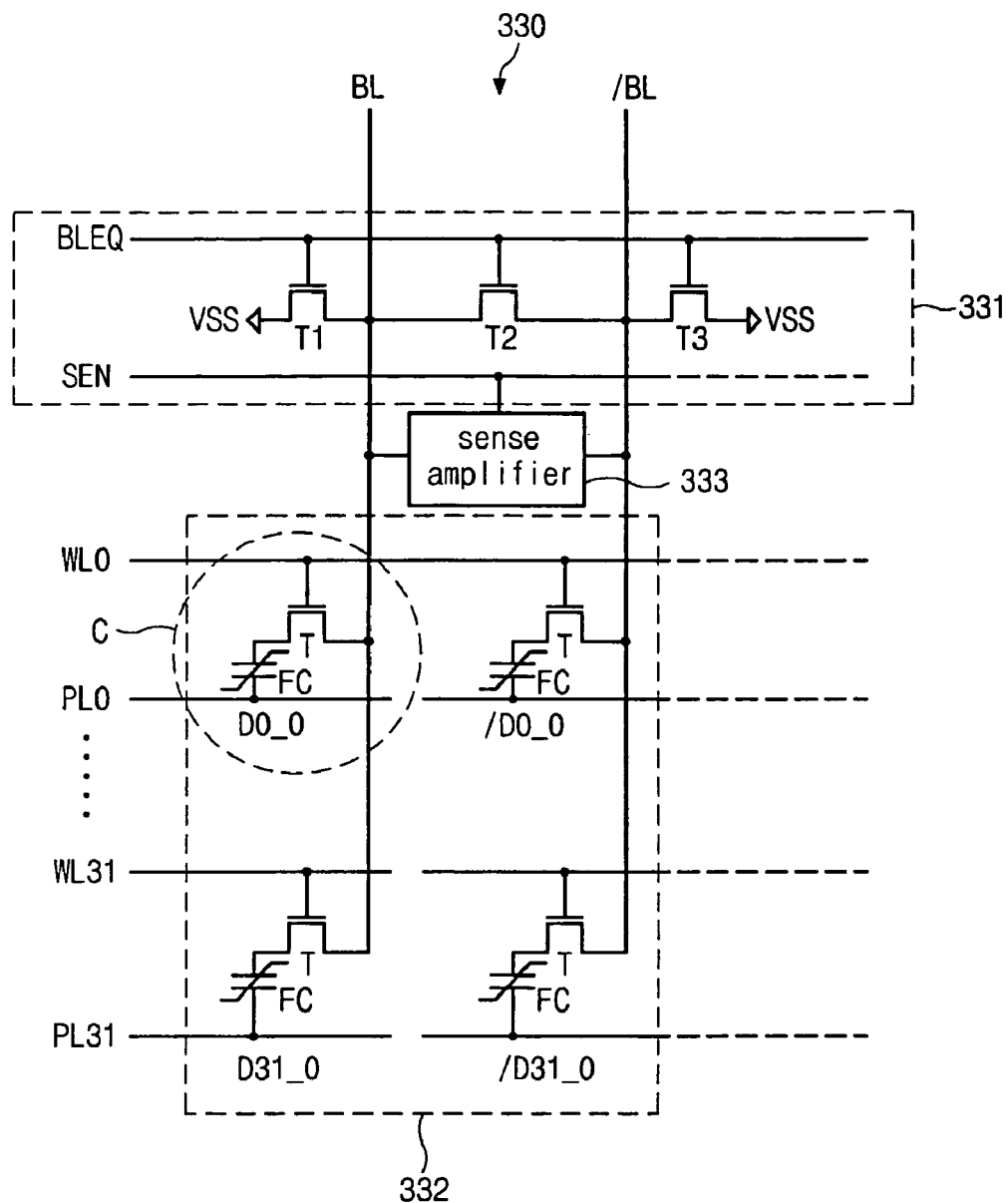
FIG. 13 is a block diagram illustrating a cell array of a memory block of FIG. 12.

FIG. 13 is a block diagram illustrating cell array 330 of memory block 300 of FIG. 12.

Cell array 330 includes a bit line equalizing unit 331, a memory array 332, and a sense amplifier 333.

Bit line equalizing unit 331 includes switching elements T1, T2, T3. Switching element T1, connected between a bit line BL and a ground voltage terminal, has a gate to receive a bit line equalizing signal BLEQ. Switching element T2, connected between the bit line BL, and a bit line bar /BL has a gate to receive bit line equalizing signal BLEQ. Switching element T3, connected between bit line bar /BL and the ground voltage terminal, has a gate to receive bit line equalizing signal BLEQ.

Sense amplifier 333 senses and amplifies data of bit line BL in response to sense amplifier enable signal SEN received from control signal block 320.

Memory array 332 includes a plurality of unit cells C. Unit cell C includes a switching element T and a ferroelectric capacitor FC that are connected serially between bit line BL or bit line bar /BL and plate line PL0. The switching operation of switching element T is controlled by a potential of word line WL0.

Figure 14:
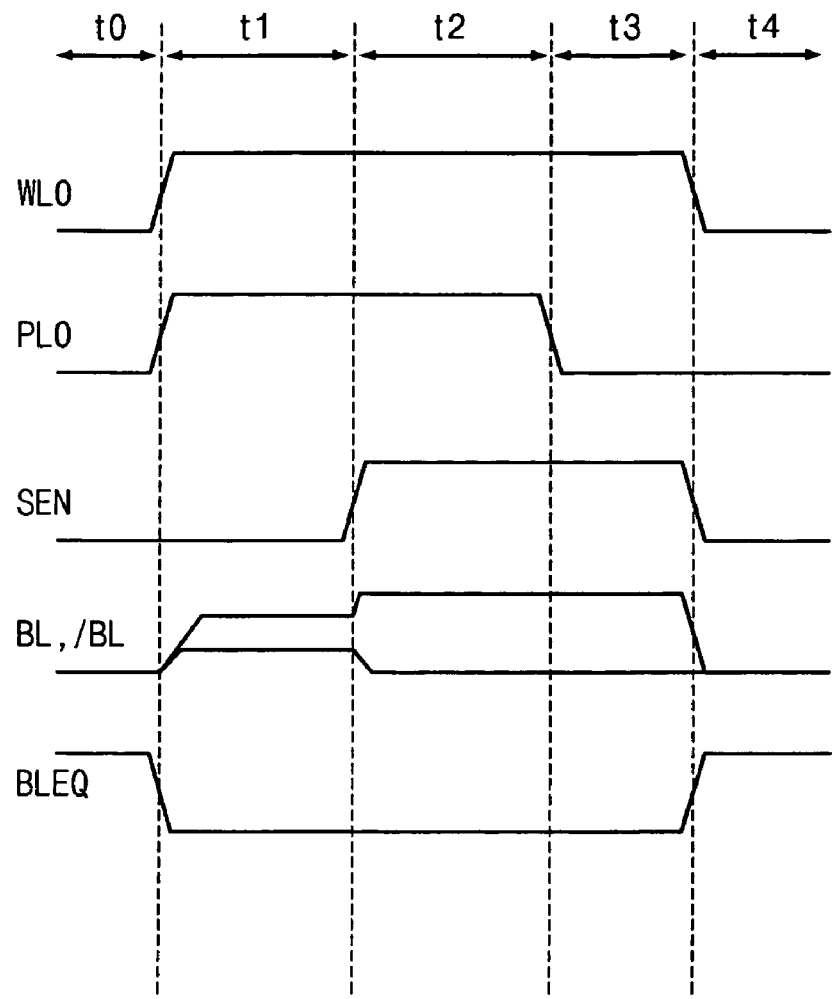
FIG. 14 is a timing diagram illustrating the operation of the cell array of FIG. 13.

FIG. 14 is a timing diagram illustrating the operation of cell array 330 of FIG. 13.

In period t0, bit line equalizing signal BLEQ becomes 'high' to turn on switching elements T1, T2, T3 of bit line equalizing unit 331. As a result, the paired bit lines BL and /BL are precharged to a ground voltage level. Word line WL0, plate line PL0, and sense amplifier enable signal SEN are maintained at a low level.

In period t1, the bit line equalizing signal BLEQ changes to a low level. Word line WL0 and plate line PL0 changes to a high level so that charges are distributed by data stored in the unit cell C to generate a voltage difference between the paired bit lines BL and /BL.

In period t2, sense amplifier enable signal SEN is enabled to a high level to activate sense amplifier 333. Sense amplifier 333 senses and amplifies the voltage difference of the paired bit lines BL and /BL. As a result, low level data '0' is restored.

In period t3, plate line PL0 changes to a low level so that high level data '1' is stored.

In period t4, word line WL and sense amplifier enable signal SEN change to a low level. Bit line equalizing signal BLEQ changes to a high level again so that the paired, bit lines BL and /BL are precharged to the ground voltage level.

As described above, consistent with an embodiment of the present invention, an integrated circuit having a RFID tag accumulates administrative information of the integrated circuit easily and analyzes defect analysis information after packaging of chips. After a test at a wafer level, subsequent test results or processing results are written in each chip to increase the efficiency of the subsequent processes. Also, processing results in each step after the test at the wafer level are continuously updated to increase the processing efficiency. An antenna of the RFID tag in the integrated circuit is formed of a wire and a lead frame metal so that an additional antenna structure is not required.

The foregoing description of various embodiments of the invention has been presented for purposes of illustrating and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skilled in the art to utilize the invention in various embodiments and with various modifications as are suited to the particular use contemplated.

What is claimed is:

1. An integrated circuit comprising:
   an integrated circuit region with a testing function;
   a Radio Frequency Identification (RFID) integrated circuit region including an RFID tag, the RFID tag being configured to store various administrative information including ID (identification) information and test results, wherein the information is stored in the RFID tag after the testing at a wafer level in response to a radio frequency signal request;
   an interface unit configured to perform the function of an interface between the integrated circuit region and the RFID integrated circuit region for storing the information in the RFID tag,
   a first antenna pad formed on the RFID integrated circuit region and connected to an RFID tag antenna; and
   a second antenna pad connected to the antenna and formed on the integrated circuit region,
   wherein the RFID tag includes:
   a memory block configured to receive an operation control signal to generate an internal control signal, store data in a nonvolatile ferroelectric capacitor in response to the internal control signal and output the stored data,
   wherein a chip confirmation code is stored in the nonvolatile ferroelectric capacitor of the RFID tag by the interface between the integrated circuit region and the RFID tag,
   wherein the RFID integrated circuit region includes the antenna formed using a wire, a lead frame and a stage, wherein the RFID integrated circuit region is formed over the stage.

2. An integrated circuit comprising:
   an integrated circuit region with a testing function;
   a Radio Frequency Identification (RFID) integrated circuit region including an RFID tag, the RFID tag being configured to store various administrative information including ID (identification) information and test results, wherein the information is stored in the RFID tag after the testing at a wafer level in response to a radio frequency signal request;
   an interface unit configured to perform the function of an interface between the integrated circuit region and the RFID integrated circuit region for storing the information in the RFID tag,
   a first antenna pad formed on the RFID integrated circuit region and connected to an RFID tag antenna; and
   a second antenna pad connected to the antenna and formed on the integrated circuit region,
   wherein the RFID tag includes:
   a memory block configured to receive an operation control signal to generate an internal control signal, store data in a nonvolatile ferroelectric capacitor in response to the internal control signal and output the stored data,
   wherein a chip confirmation code is stored in the nonvolatile ferroelectric capacitor of the RFID tag by the interface between the integrated circuit region and the RFID tag,
   wherein the integrated circuit is formed in a FBGA (Fine Pitch Ball Grid Array) form factor,
   wherein the RFID integrated circuit region includes the antenna formed using a wire, a lead frame and a stage, wherein the RFID integrated circuit region is formed over the stage.

3. The integrated circuit according to claim 1, wherein the integrated circuit is one of a DRAM, a flash memory, a FeRAM, a CPU, an SOC, an ASIC, and a solid state semiconductor.

4. The integrated circuit according to claim 1, wherein the RFID integrated circuit region includes:
   an analog block configured to receive a radio frequency signal to output an operation command signal; and
   a digital block configured to generate an address and the operation control signal in response to the operation command signal, and output a response signal corresponding to the operation command signal to the analog block.

5. The integrated circuit according to claim 4, wherein the memory block includes:
   a word line decoder configured to decode the address to select a word line;
   a control signal block configured to generate the internal control signal in response to the operation control signal;
   a cell array configured to store the data; and
   an input/output block configured to control data input/output between the cell array and a data bus in response to the internal control signal.

6. The integrated circuit according to claim 5, wherein the cell array includes:
   a sense amplifier configured to sense and amplify the data in response to the internal control signal;
   a bit line equalizing unit configured to precharge a bit line in response to a bit line equalizing signal; and
   a memory array having a plurality of unit cells.

* * * * *